United States Patent
Yang et al.

(10) Patent No.: US 11,158,685 B2
(45) Date of Patent: Oct. 26, 2021

(54) ORGANIC LIGHT-EMITTING DIODE TOUCH DISPLAY OPERATING METHOD

(71) Applicant: Raydium Semiconductor Corporation, Hsinchu (TW)

(72) Inventors: Chen-Wei Yang, Hsinchu (TW); Cheng-Nan Lin, Taipei (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 35 days.

(21) Appl. No.: 16/178,733

(22) Filed: Nov. 2, 2018

(65) Prior Publication Data
US 2019/0140024 A1 May 9, 2019

Related U.S. Application Data

(60) Provisional application No. 62/581,083, filed on Nov. 3, 2017.

(51) Int. Cl.
*H01L 27/32* (2006.01)
*G06F 3/041* (2006.01)

(52) U.S. Cl.
CPC .......... *H01L 27/323* (2013.01); *G06F 3/0416* (2013.01); *G06F 3/04184* (2019.05); *G06F 3/0412* (2013.01)

(58) Field of Classification Search
None
See application file for complete search history.

(56) References Cited

U.S. PATENT DOCUMENTS

| | | | | |
|---|---|---|---|---|
| 8,952,923 B2* | 2/2015 | Mizuhashi | ........... | G09G 3/3655 345/174 |
| 9,088,287 B2* | 7/2015 | Choi | ..................... | H03K 23/667 |
| 9,164,641 B1* | 10/2015 | Rowe | .................. | G06F 3/04184 |
| 9,354,745 B2* | 5/2016 | Noguchi | ................ | G06F 3/0412 |
| 10,082,900 B2* | 9/2018 | Liu | ......................... | G06F 3/044 |
| 2012/0019454 A1* | 1/2012 | Huang | .................. | G06F 3/0412 345/173 |
| 2012/0068961 A1* | 3/2012 | Mizuhashi | ........... | G09G 3/3655 345/174 |
| 2012/0113045 A1* | 5/2012 | Lai | .......................... | G09G 3/20 345/174 |
| 2013/0069894 A1* | 3/2013 | Chen | ..................... | G06F 3/0412 345/173 |
| 2013/0069895 A1* | 3/2013 | Lo | ........................ | G06F 3/04184 345/173 |
| 2013/0285952 A1* | 10/2013 | Huang | ................ | G06F 3/04166 345/173 |

(Continued)

*Primary Examiner* — Patrick N Edouard
*Assistant Examiner* — Peijie Shen

(57) ABSTRACT

An OLED touch display operation method is disclosed. The OLED touch display operation method includes the following steps: controlling a touch scan transition timing and a display multiplexer switching timing to maintain a specific equidistant relationship; when the OLED touch display performs display function, the OLED touch display performs touch scanning only for a part of display time, and stops touch scanning or performs touch voltage compensation scanning for another part of display time; and when being interfered by external noise, the OLED touch display performs touch scanning only in a blanking period out of the display time and the touch scanning frequency can be adjusted to avoid interference of external noise.

10 Claims, 11 Drawing Sheets

(56) References Cited

U.S. PATENT DOCUMENTS

| | | | |
|---|---|---|---|
| 2013/0293491 A1* | 11/2013 | Doi | G09G 3/3674 345/173 |
| 2013/0328797 A1* | 12/2013 | Al-Dahle | G06F 1/3262 345/173 |
| 2014/0048854 A1* | 2/2014 | Wang | H01L 27/1255 257/254 |
| 2014/0111471 A1* | 4/2014 | Zhao | G06F 3/0446 345/174 |
| 2014/0184539 A1* | 7/2014 | Shin | G06F 3/041661 345/173 |
| 2014/0184937 A1* | 7/2014 | Lim | G06F 3/0446 349/12 |
| 2014/0306906 A1* | 10/2014 | Huang | G06F 3/0412 345/173 |
| 2015/0116266 A1* | 4/2015 | Inoue | G06F 3/0445 345/174 |
| 2015/0160761 A1* | 6/2015 | Lee | G06F 3/04184 345/174 |
| 2015/0268777 A1* | 9/2015 | Okamura | G06F 3/0446 345/205 |
| 2015/0364117 A1* | 12/2015 | Azumi | G09G 3/3674 345/174 |
| 2016/0092010 A1* | 3/2016 | Agarwal | G09G 5/12 345/173 |
| 2016/0328076 A1* | 11/2016 | Pan | G06F 3/04166 |
| 2016/0370940 A1* | 12/2016 | Zhao | G06F 3/04184 |
| 2017/0010730 A1* | 1/2017 | Chuang | G06F 3/0443 |
| 2017/0052637 A1* | 2/2017 | Lu | G06F 3/04184 |
| 2017/0075448 A1* | 3/2017 | Kang | G06F 3/041661 |
| 2017/0123552 A1* | 5/2017 | Brunet | G06F 3/04184 |
| 2017/0192534 A1* | 7/2017 | Han | G06F 3/0383 |
| 2018/0040267 A1* | 2/2018 | Huang | G09G 3/20 |
| 2018/0275827 A1* | 9/2018 | Lin | G06F 3/04184 |
| 2019/0079636 A1* | 3/2019 | Lee | G06F 3/0412 |
| 2019/0108810 A1* | 4/2019 | Iwase | G06F 3/0412 |
| 2019/0129555 A1* | 5/2019 | Chiang | G06F 3/0448 |

\* cited by examiner

ORGANIC LIGHT-EMITTING DIODE TOUCH DISPLAY OPERATING METHOD

BACKGROUND OF THE INVENTION

1. Field of the Invention

The invention relates to a display; in particular, to an organic light-emitting diode touch display operating method.

2. Description of the Prior Art

Please refer to FIG. 1. FIG. 1 illustrates a schematic diagram of the luminated structure of the conventional in-cell organic light-emitting diode touch display.

As shown in FIG. 1, based on the consideration of manufacturing process yield and thickness, since the distance between the touch electrode ITO and the cathode CA is quite small (<2 um), the mutual influence between the touch electrode ITO and the cathode CA will be serious.

When the touch mode and the display mode of the conventional in-cell organic light-emitting diode touch display operate simultaneously, the display quality of the organic light-emitting diode OLED will be affected by the touch sensing of the touch electrode ITO, and the color band and flicker appear in the frame displayed on the conventional in-cell organic light-emitting diode touch display.

While the touch mode and the display mode of the conventional in-cell organic light-emitting diode touch display operate at different times, although the interaction between touch and display can be avoided, problems of limiting touch scan time, increasing touch scan interval and increasing touch power will be generated.

SUMMARY OF THE INVENTION

Therefore, the invention provides an organic light-emitting diode touch display operating method to solve the above-mentioned problems A preferred embodiment of the invention is an organic light-emitting diode (OLED) touch display operation method. In this embodiment, the OLED touch display operation method includes the following steps: controlling a touch scan transition timing and a display multiplexer switching timing to maintain a specific equidistant relationship; and when the OLED touch display performs display function, the OLED touch display performs touch scanning only for a part of display time.

In an embodiment, the OLED touch display stops the touch scanning for another part of the display time.

In an embodiment, the OLED touch display performs a touch voltage compensation scanning for another part of the display time.

In an embodiment, when being interfered by an external noise, the OLED touch display performs the touch scanning only in a blanking period out of the display time.

In an embodiment, the OLED touch display further adjusts a touch scanning frequency to avoid an interference of the external noise.

In an embodiment, the OLED touch display device includes an automatic switching circuit to automatically switch between a touch oscillator and a display oscillator to provide a touch driving clock signal as an output clock signal in a first operation mode and provide a display driving clock signal as the output clock signal in a second operation mode.

In an embodiment, the automatic switching circuit includes a touch oscillator, a display oscillator, a multiplexer and a deglitching unit, the touch oscillator and the display oscillator are coupled to the multiplexer, the multiplexer is coupled to the deglitching unit.

In an embodiment, in the first operation mode, the multiplexer automatically switches to the touch oscillator and outputs the touch driving clock signal provided by the touch oscillator to the deglitching unit and the deglitching unit processes the touch driving clock signal and then provides the processed touch driving clock signal as the output clock signal.

In an embodiment, in the second operation mode, the multiplexer automatically switches to the display oscillator and outputs the display driving clock signal provided by the display oscillator to the deglitching unit and the deglitching unit processes the display driving clock signal and then provides the processed display driving clock signal as the output clock signal.

In an embodiment, the first operation mode is a sleep mode and the second operation mode is a display mode or an idle mode.

Compared to the prior art, the OLED touch display operating method of the invention can operate the touch mode and the display mode simultaneously by maintaining a specific equidistant relationship between the touch scan transition timing and the display multiplexer switching timing without color band and flicker in the frame displayed by the OLED touch display. Therefore, the OLED touch display operating method of the invention can effectively improve the display quality of the OLED touch display and avoid the problems of limiting touch scan time, increasing touch scan interval and increasing touch power, so that the touch signal-to-noise ratio can be increased and more charging time can be provided.

The advantage and spirit of the invention may be understood by the following detailed descriptions together with the appended drawings.

BRIEF DESCRIPTION OF THE APPENDED DRAWINGS

FIG. 5~FIG. 8B illustrate schematic diagrams of different embodiments of avoiding uneven display by interlacing touch scanning.

Figure 9:
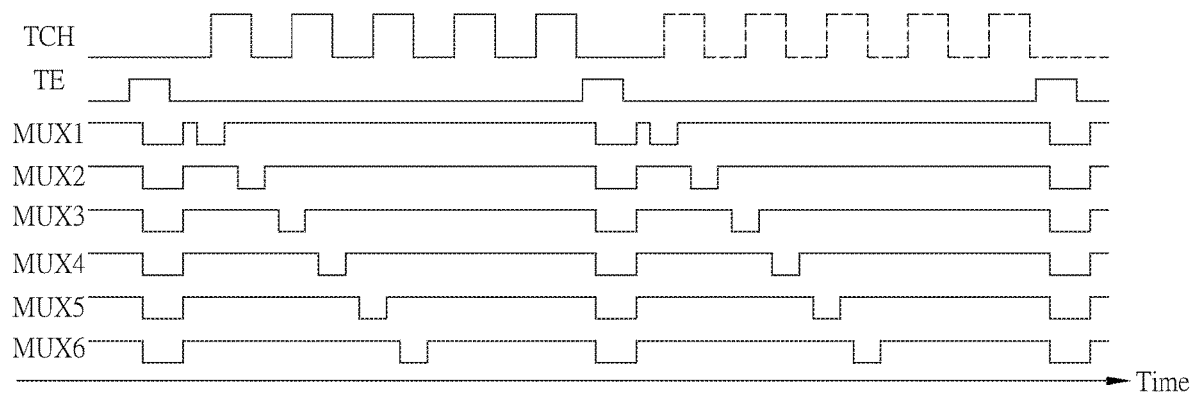

FIG. 9 illustrates a schematic diagram of performing touch scanning in a part of the display time and performing touch voltage compensation scanning in another part of the display time.

FIG. 10~FIG. 13 illustrate different embodiments of avoiding uneven display by performing touch scanning and touch voltage compensation scanning in different display times respectively.

Figure 14A:
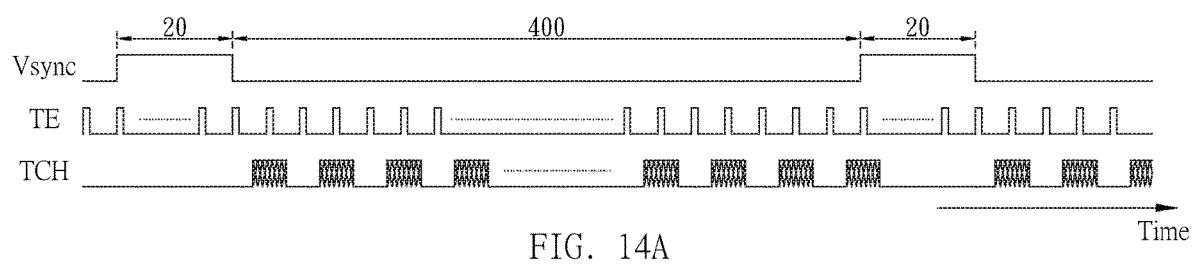
Figure 14B:
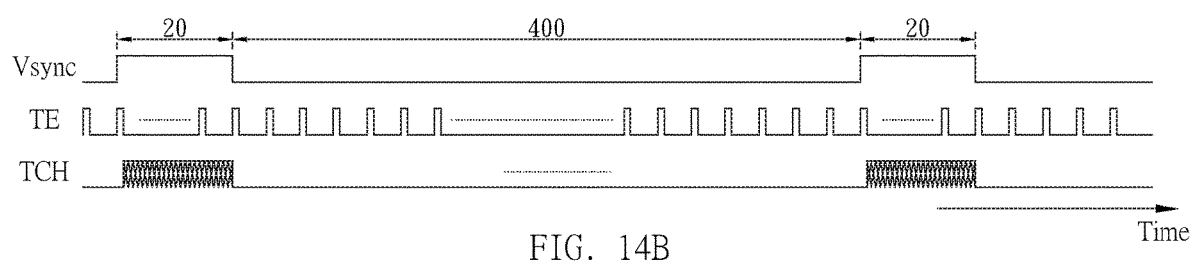

FIG. 14A~FIG. 14B illustrate an embodiment of dynamically adjusting the touch scanning frequency when encountering external noise interference.

Figure 15A:
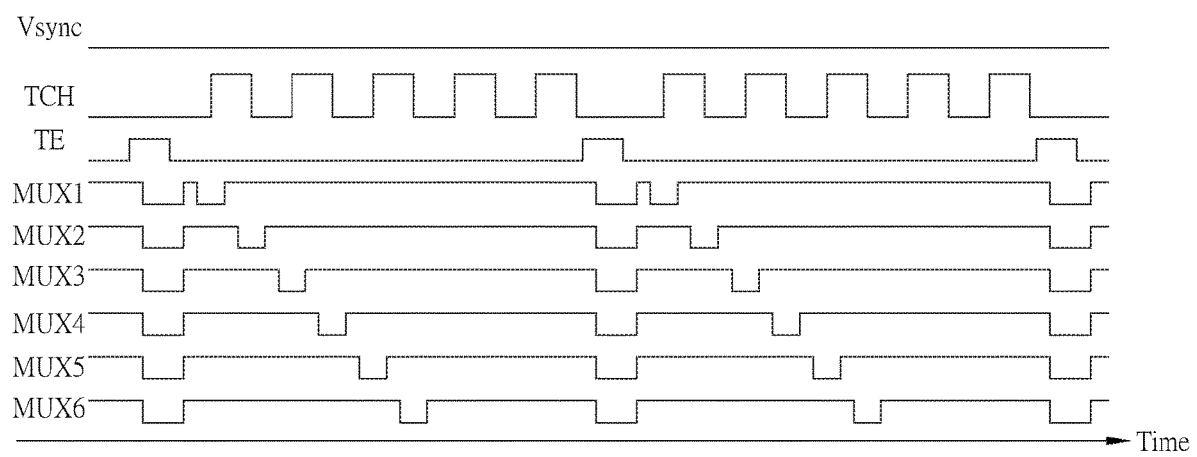
Figure 15B:
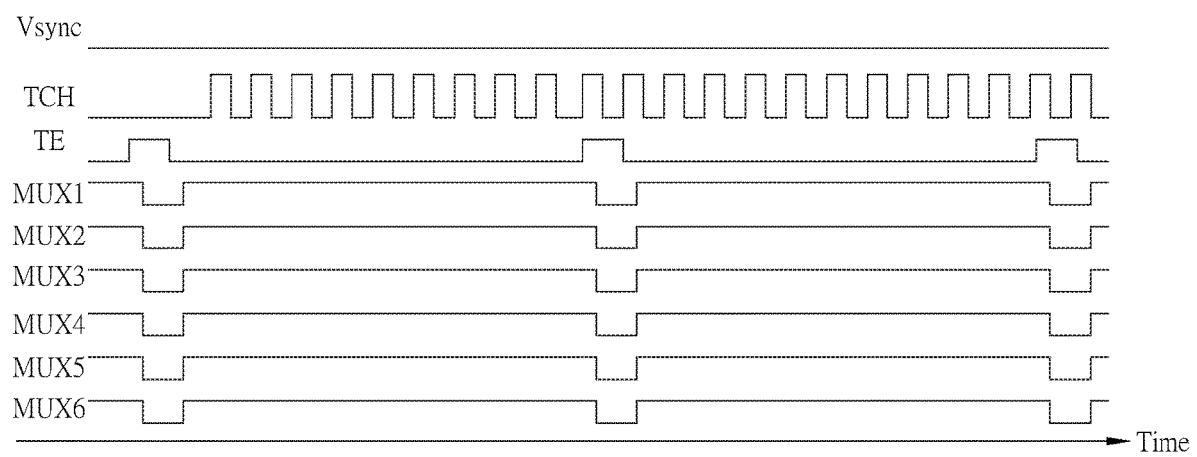

FIG. 15A~FIG. 15B illustrate another embodiment of dynamically adjusting the touch scanning frequency when encountering external noise interference.

Figure 16:
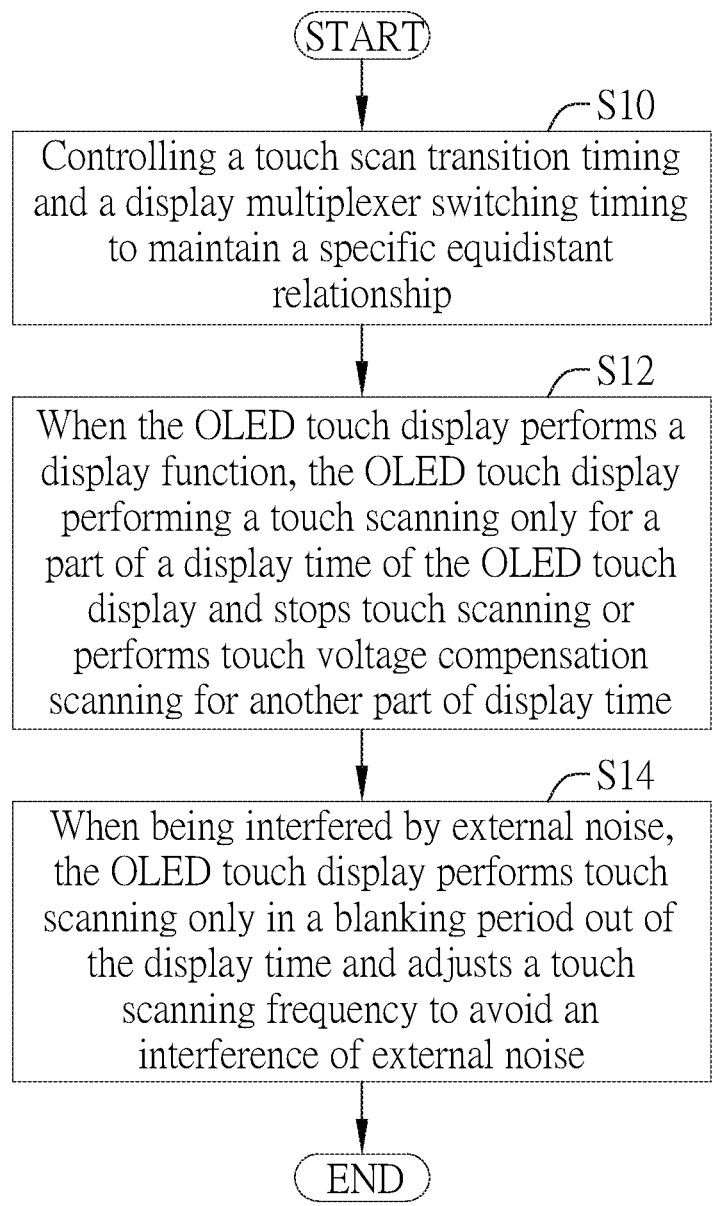

FIG. 16 illustrates a flowchart of the OLED touch display operating method in an embodiment of the invention.

DETAILED DESCRIPTION OF THE INVENTION

An embodiment of the invention is an organic light-emitting diode (OLED) touch display operating method used to operate the OLED touch display, so that its touch mode and display mode can operate simultaneously without color band and flicker appeared in the frame displayed on the OLED touch display. In fact, the OLED touch display can be an in-cell OLED touch display, but not limited to this.

Figure 1:
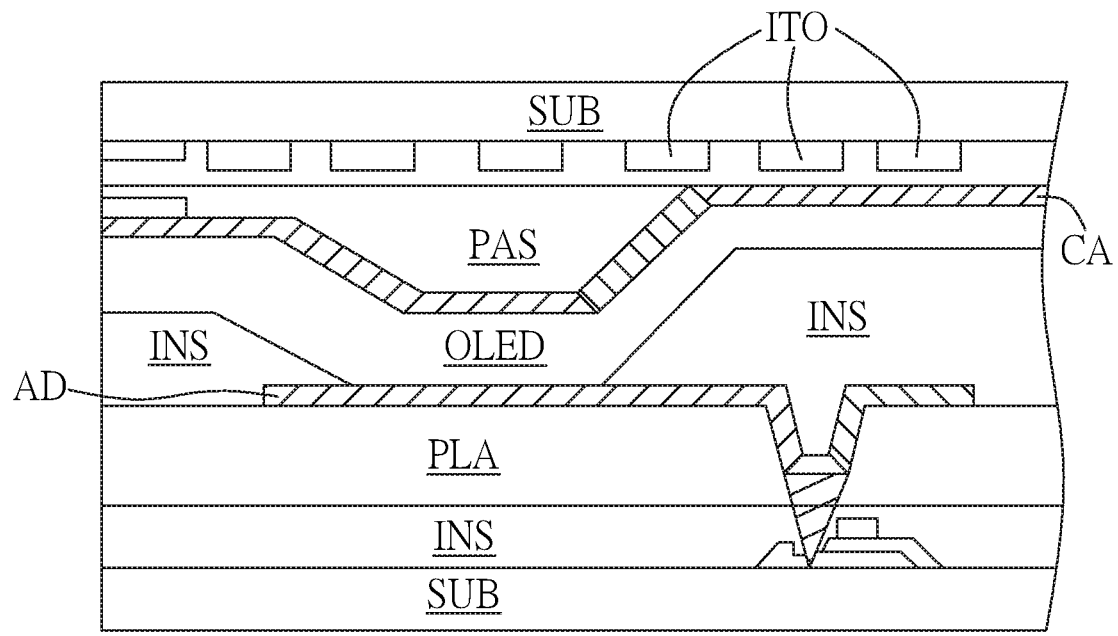
FIG. 1 illustrates a schematic diagram of the luminated structure of the conventional in-cell OLED touch display.
Figure 2:
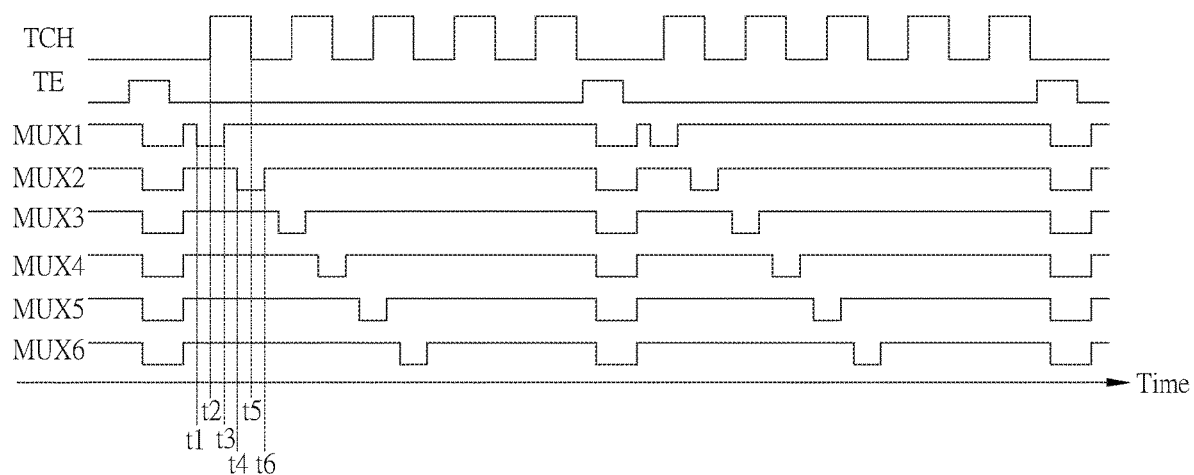
FIG. 2 illustrates a schematic diagram of maintaining a specific equidistant relationship between the touch scan transition timing and the display multiplexer transition timing.

Please refer to FIG. 2. FIG. 2 illustrates a schematic diagram of maintaining a specific equidistant relationship between the touch scan transition timing and the display multiplexer transition timing.

As shown in FIG. 2, when the OLED touch display is used to display images, the touch scan transition timing TCH and the display multiplexer transition timings MUX1~MUX6 can be fully controlled to maintain a specific equidistant relationship without interfering with each other by sharing the display driving timing signal and the timing signal TE provided by the display driver. Therefore, the color band and flicker appeared in the frame displayed by the OLED touch display can be avoided and the signal-to-noise ratio of touch sensing can be improved at the same time.

For example, FIG. 2 shows that the front edge and the back edge of the display multiplexer transition timing MUX1 correspond to the time t1 and the time t3 respectively, and the front edge of the touch scan transition timing TCH corresponds to the time t2 between the time t1 and the time t3, so that the touch scan transition timing TCH and the display multiplexer transition timing MUX1 can maintain a specific equidistant relationship; similarly, the front edge and the back edge of the display multiplexer transition timing MUX2 correspond to the time t4 and the time t6 respectively, and the front edge of the touch scan transition timing TCH corresponds to the time t5 between the time t4 and the time t6, so that the touch scan transition timing TCH and the display multiplexer transition timing MUX2 can maintain a specific equidistant relationship. In addition, FIG. 2 also shows that a time interval between the first time t1 and the second time t2 is equal to a time interval between the second time t2 and the third time t3, a time interval between the fourth time t4 and the fifth time t5 is equal to a time interval between the fifth time t5 and the sixth time t6, a time interval between the second time t2 and the fifth time t5 is different from a time interval between the first time t1 and the third time t3, a time interval between the second time t2 and the fifth time t5 is different from a time interval between the fourth time t4 and the sixth time t6, a time interval between the first time t1 and the third time t3 is equal to a time interval between the fourth time t4 and the sixth time t6, the touch scan transition timing TCH and the first display multiplexer transition timing MUX1 have different frequencies, the touch scan transition timing TCH and the second display multiplexer transition timing MUX2 have different frequencies, the first display multiplexer transition timing MUX1 and the second display multiplexer transition timing MUX2 have the same frequency, and a time interval between the second time t2 and the fifth time t5 is larger than a time interval between the first time t1 and the third time t3 and a time interval between the fourth time t4 and the sixth time t6.

Figure 3:
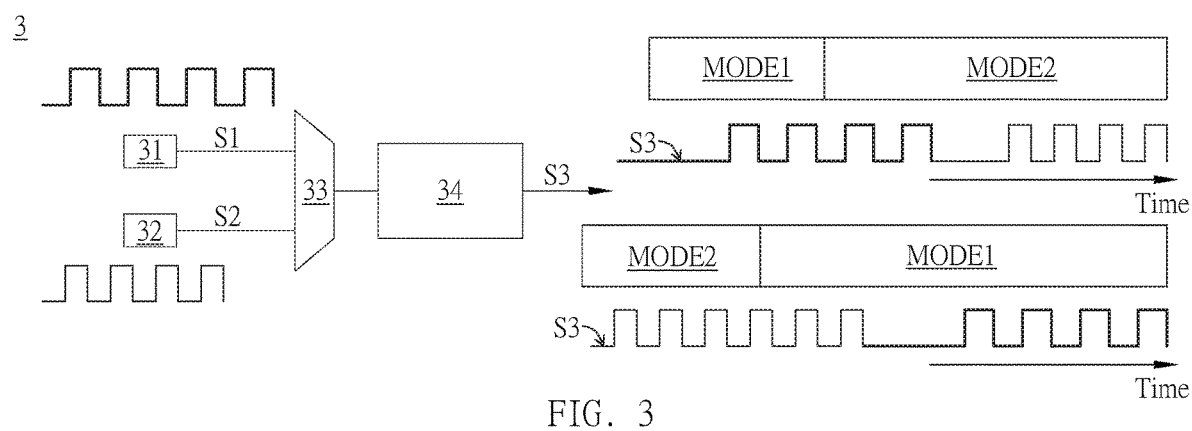
FIG. 3 illustrates a schematic diagram of automatic switching between the touch driving timing signal and the display driving timing signal in different operating modes.

Please refer to FIG. 3. FIG. 3 illustrates a schematic diagram of automatic switching between the touch driving timing signal and the display driving timing signal in different operating modes.

As shown in FIG. 3, the automatic switching circuit 3 can include a touch oscillator 31, a display oscillator 32, a multiplexer 33 and a deglitching unit 34. In the first operation mode (e.g., the sleep mode) MODE1, the multiplexer 33 will automatically switch to the touch oscillator 31 and output the touch driving timing signal S1 provided by the touch oscillator 31 to the deglitching unit 34. After the deglitching unit 34 processes the touch driving timing signal S1, the deglitching unit 34 provides the processed touch driving timing signal S1 as an output timing signal S3. In the second operation mode (e.g., the display mode/the idle mode) MODE2, the multiplexer 33 will automatically switch to the display oscillator 32 and output the display driving timing signal S2 provided by the display oscillator 32 to the deglitching unit 34. After the deglitching unit 34 processes the display driving timing signal S2, the deglitching unit 34 provides the processed display driving timing signal S2 as the output clock signal S3.

Therefore, when switching from the first operation mode (e.g., the sleep mode) MODE1 to the second operation mode (e.g., the display mode/the idle mode) MODE2, the output timing signal S3 will be changed from the touch driving timing signal S1 to the display driving timing signal S2. When switching from the second operation mode (e.g., the display mode/the idle mode) MODE2 to the first operation mode (e.g., the sleep mode) MODE1, the output timing signal S3 will be changed from the display driving timing signal S2 to the touch driving timing signal S1.

Figure 4:
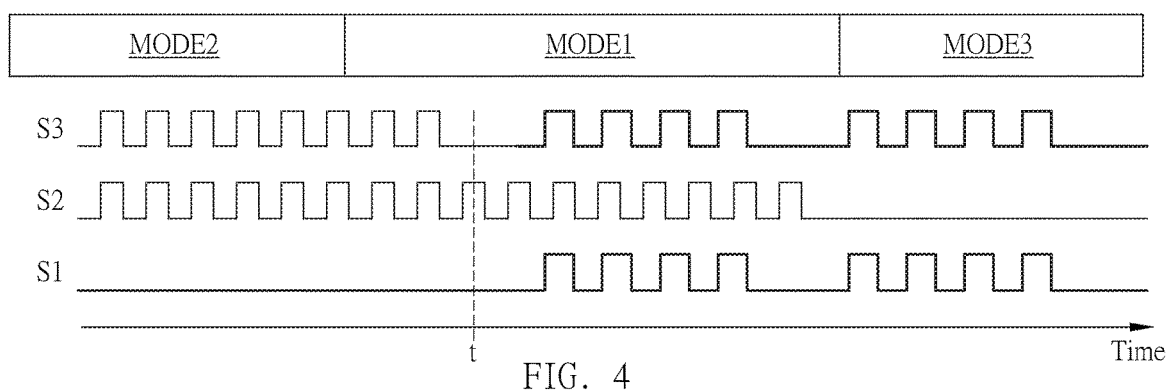
FIG. 4 illustrates the corresponding relationships between the auto-switched output timing signal and the touch driving timing signal and the display driving timing signal in different operating modes.

As to FIG. 4, FIG. 4 illustrates the corresponding relationships between the auto-switched output timing signal S3 and the touch driving timing signal S1 and the display driving timing signal S2 in different operating modes.

As shown in FIG. 4, initially, in the second operation mode (e.g., the display mode/the idle mode) MODE2, the display driving clock signal S2 is provided as the output timing signal S3. Then, after switching from the second operation mode (e.g., the display mode/the idle mode) MODE2 to the first operation mode (e.g., the sleep mode) MODE1, the multiplexer 33 switches at the time t to make the output timing signal S3 change to the touch driving timing signal S1. After switching from the first operation mode (e.g., the sleep mode) MODE1 to the third operation mode (e.g., the touch mode) MODE3, the output timing signal S3 maintains the touch driving timing signal S1 unchanged.

However, even in the case where the touch scan transition timing and the display multiplexer transition timing maintain a certain equidistant relationship, the display may be uneven due to the touch coupling additional voltage to the display, so the invention proposes the following methods to solve this problem:

(1) When the OLED touch display performs the display function, the touch scanning is not performed at all display times, but performed by interlacing touch scanning, that is, the touch scanning is performed at a part of the display time, but the touch scanning is stopped at another part of the display time, so as to effectively avoid uneven display.

For example, please refer to FIG. 5~FIG. 8B illustrate schematic diagrams of different embodiments of avoiding uneven display by interlacing touch scanning. Wherein, Vsync represents a vertical sync signal, 20 and 400 represent the number of display lines, TCH represents the touch scan transition timing and TE represents a timing signal indicating each display line.

Figure 5:
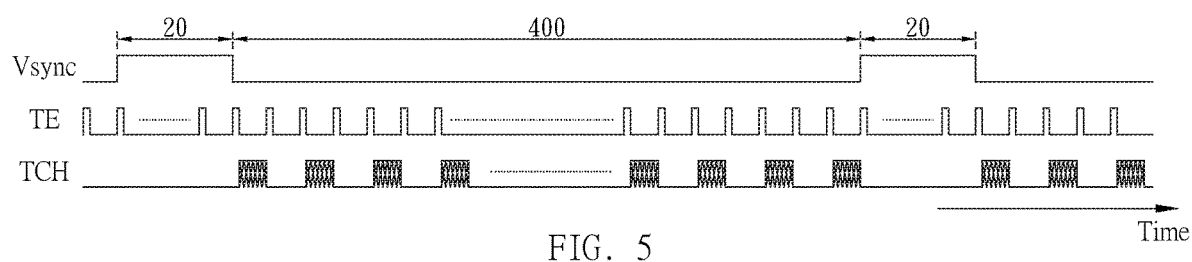
Figure 6:
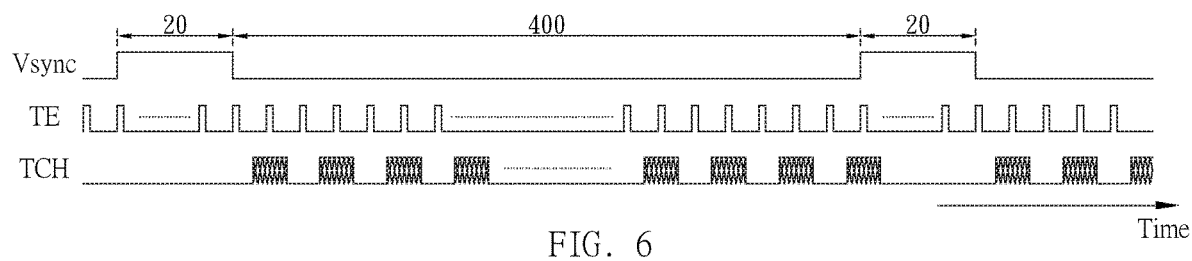

FIG. 5 illustrates that the touch scan transition timing TCH performs touch scanning only when the OLED touch display displays the odd-numbered display lines, and no touch scanning is performed when the OLED touch display displays the even-numbered display lines, and vice versa; FIG. 6 illustrates that the touch scan transition timing TCH performs touch scanning only at the time between the adjacent odd-numbered display line and the even-numbered display line displayed by the OLED touch display, and no touch scanning is performed at the time between the adjacent the even-numbered display line and the odd-numbered display line displayed by the OLED touch displays, and vice versa.

Figure 7:
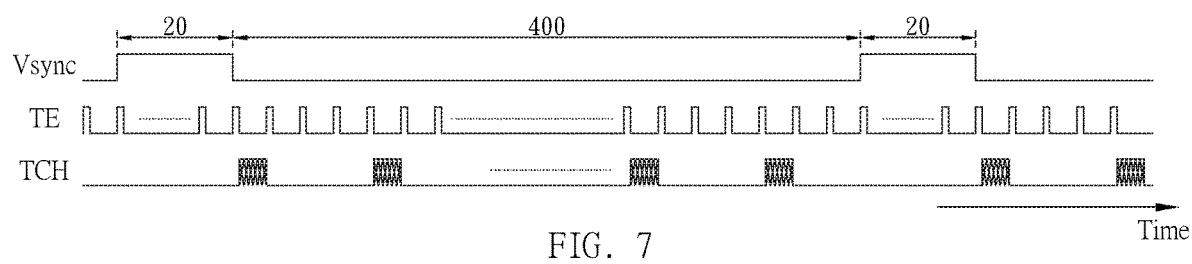
Figure 8A:
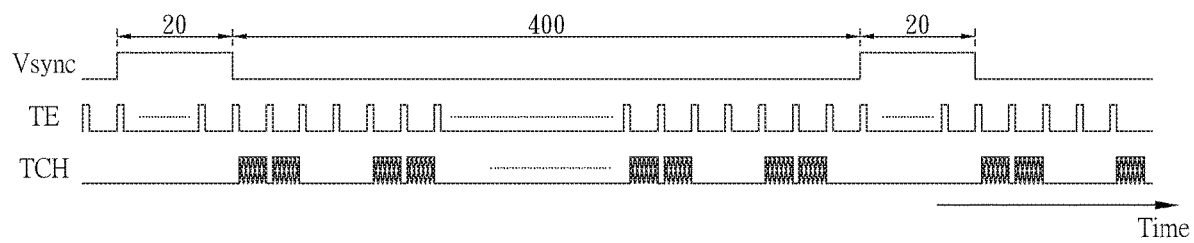
Figure 8B:
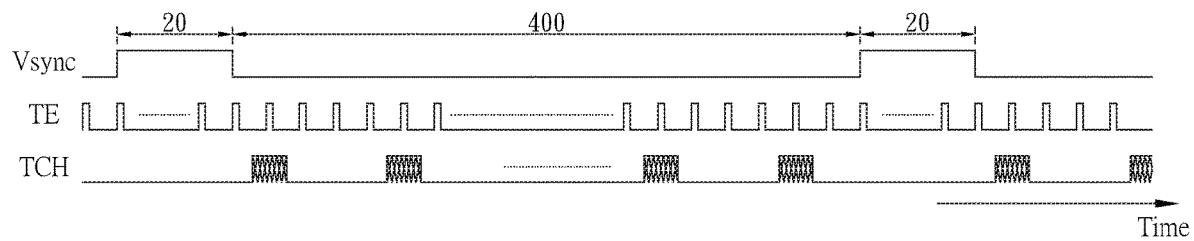

In addition, the touch scan transition timing TCH can perform touch scanning when the OLED touch display displays N display lines, and then the touch scan transition timing TCH can stop touch scanning when the OLED touch display displays the next M display lines, wherein N/M is larger than 0. As shown in FIG. 7, the touch scan transition timing TCH performs touch scanning for one display line and then stop touch scanning for the next three display lines. As shown in FIG. 8A, the touch scan transition timing TCH performs touch scanning for two display lines and then stop touch scanning for the next two display lines. As shown in FIG. 8B, the touch scan transition timing TCH performs touch scanning at the time between one set of adjacent display lines and then stop touch scanning at the times between the next three sets of adjacent display lines, and vice versa.

(2) When the OLED touch display performs display function, the touch scan transition timing TCH can perform touch scanning at a part of the display time, but the touch scan transition timing TCH performs touch voltage compensation scanning at another part of the display time to effectively avoid the phenomenon of uneven display. As shown in the touch scan transition timing TCH in FIG. 9, the solid line portion of the touch scan transition timing TCH represents the touch scanning performed at a part of display time, and the dotted portion of the touch scan transition timing TCH represents the touch voltage compensation scanning at another part of display time.

Figure 10:
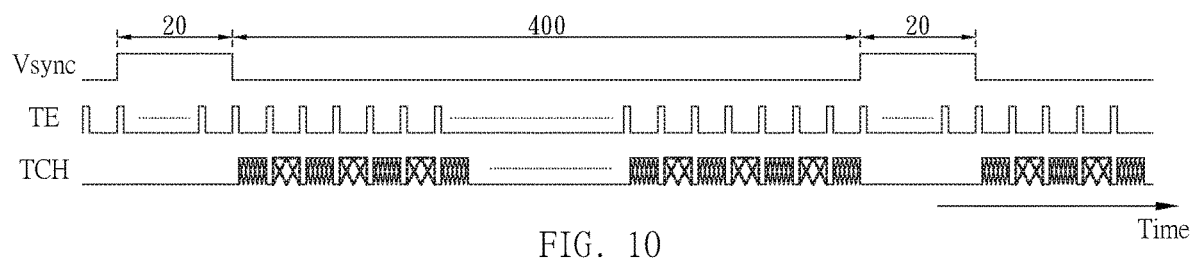

FIG. 10~FIG. 13 illustrate different embodiments of avoiding uneven display by performing touch scanning and touch voltage compensation scanning in different display times respectively. FIG. 10 shows that the touch scan transition timing TCH performs touch scanning (indicated by the dense X of the solid line) when the OLED touch display displays the odd-numbered display lines, and the touch scan transition timing TCH performs touch voltage compensation scanning (indicated by the less dense X of the broken line) when the OLED touch display displays the even-numbered display lines, and vice versa.

In addition, the touch scan transition timing TCH can perform touch scanning (indicated by the dense X of the solid line) when the OLED touch display displays N display lines, and then the touch scan transition timing TCH can perform touch voltage compensation scanning (indicated by the less dense X of the broken line) when the OLED touch display displays the next M display lines, wherein N/M is larger than 0.

Figure 11:
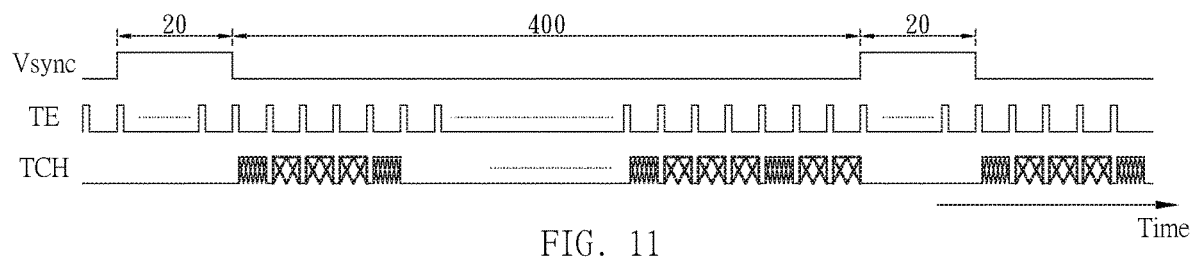
Figure 12:
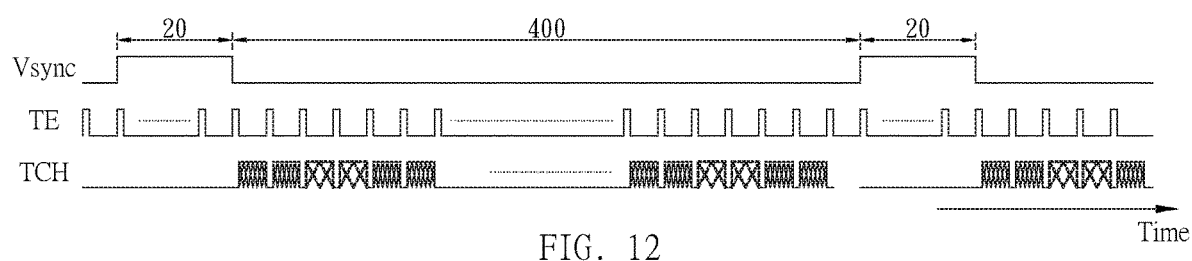
Figure 13:
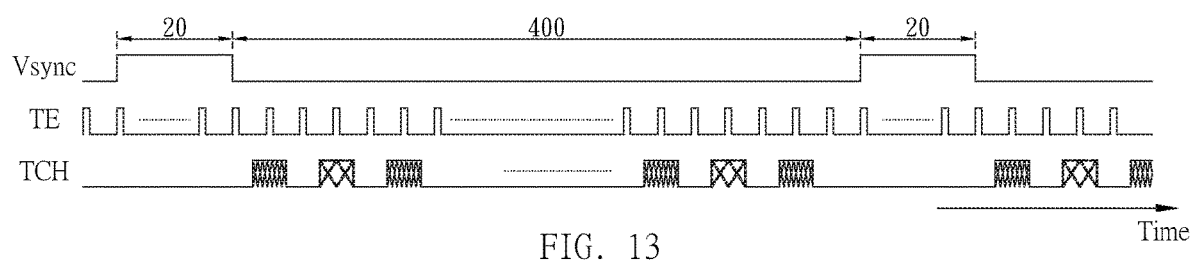

As shown in FIG. 11, the touch scan transition timing TCH performs touch scanning (indicated by the dense X of the solid line) for one display line and then performs touch voltage compensation scanning (indicated by the less dense X of the broken line) for the next three display lines. As shown in FIG. 12, the touch scan transition timing TCH performs touch scanning (indicated by the dense X of the solid line) for two display lines and then performs touch voltage compensation scanning (indicated by the less dense X of the broken line) for the next two display lines. As shown in FIG. 13, the touch scan transition timing TCH performs touch scanning (indicated by the dense X of the solid line) at the time between one set of adjacent display lines and then performs touch voltage compensation scanning (indicated by the less dense X of the broken line) at the times between the next one set of adjacent display lines, and vice versa.

(3) When the OLED touch display performs display function, the touch scan timing and the display timing must be matched with each other. Therefore, when external noise interference is encountered, the touch scan transition timing TCH can move the touch scanning interval to the blanking interval out of the display time and adjust the touch scanning frequency to avoid the interference of external noise.

For example, when encountering external noise interference, the touch scan transition timing TCH can automatically move the touch scanning interval to the blanking interval out of the display time, since the OLED touch display will not perform display function in the blanking interval, the touch scan transition timing TCH can perform continuous touch scanning in the blanking interval and dynamically change different touch scanning frequencies without affecting the display quality of the OLED touch display.

As shown in FIG. 14A and FIG. 14B, when external noise interference is encountered, the touch scan transition timing TCH can automatically move the touch scanning interval to the vertical blanking interval (V-Blanking) out of the display time, and the touch scan transition timing TCH can perform touch scanning in the vertical blanking interval without affecting the display quality of the OLED touch display.

As shown in FIG. 15A and FIG. 15B, when external noise interference is encountered, the touch scan transition timing TCH can automatically move the touch scanning interval from the display time that the display multiplexer transition timings MUX1~MUX6 perform switching in FIG. 15A to the vertical blanking interval (V-Blanking) that the display multiplexer transition timings MUX1~MUX6 do not perform switching in FIG. 15B, since the vertical blanking interval is out of the display time and the OLED touch display will not perform display function in the vertical blanking interval, the touch scan transition timing TCH can perform touch scanning and adjust the touch scanning frequency, for example, the touch scanning frequency can be adjusted from the lower touch scanning frequency in FIG. 15A to the higher touch scanning frequency in FIG. 15B to avoid the interference of external noise.

Please refer to FIG. 16. FIG. 16 is a flowchart illustrating the OLED touch display operating method. The OLED touch display operating method is used to operate an OLED touch display. The OLED touch display performs touch scanning according to a touch scan transition timing and performs display according to a display multiplexer transition timing. As shown in FIG. 16, the OLED touch display operating method includes following steps:

Step S10: controlling a touch scan transition timing and a display multiplexer switching timing to maintain a specific equidistant relationship;

Step S12: when the OLED touch display performs a display function, the OLED touch display performing a touch scanning only for a part of a display time of the OLED touch display and stops touch scanning or performs touch voltage compensation scanning for another part of display time;

Step S14: when being interfered by external noise, the OLED touch display performs touch scanning only in a blanking period out of the display time and adjusts a touch scanning frequency to avoid an interference of external noise.

Compared to the prior art, the OLED touch display operating method of the invention can operate the touch mode and the display mode simultaneously by maintaining a specific equidistant relationship between the touch scan transition timing and the display multiplexer switching timing without color band and flicker in the frame displayed by the OLED touch display. Therefore, the OLED touch display operating method of the invention can effectively improve the display quality of the OLED touch display and avoid the problems of limiting touch scan time, increasing touch scan interval and increasing touch power, so that the touch signal-to-noise ratio can be increased and more charging time can be provided.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. An organic light-emitting diode (OLED) touch display operation method, used for operating an OLED touch display, comprising steps of:
   controlling a front edge and a back edge of a first display multiplexer transition timing to correspond to a first time and a third time respectively, and controlling a front edge of a touch scan transition timing to correspond to a second time between the first time and the third time; and
   controlling a front edge and a back edge of a second display multiplexer transition timing to correspond to a fourth time and a sixth time respectively, and controlling a back edge of the touch scan transition timing to correspond to a fifth time between the fourth time and the sixth time;
   wherein when the OLED touch display performs a display function, a touch scanning is performed at a part of a display time comprising the first display multiplexer transition timing and the second display multiplexer transition timing;
   wherein the OLED touch display device comprises an automatic switching circuit, and the automatic switching circuit comprises a touch oscillator, a display oscillator, a multiplexer and a deglitching unit, the touch oscillator and the display oscillator are coupled to the multiplexer, the multiplexer is coupled to the deglitching unit; in a first operation mode, the multiplexer is configured to automatically switch to the touch oscillator and output a touch driving timing signal provided by the touch oscillator to the deglitching unit, and then the deglitching unit is configured to process the touch driving timing signal and provide the processed touch driving timing signal as an output timing signal; in a second operation mode, the multiplexer is configured to automatically switch to the display oscillator and output a display driving timing signal provided by the display oscillator to the deglitching unit, and then the deglitching unit is configured to process the display driving timing signal and provide the processed display driving timing signal as the output timing signal.

2. The OLED touch display operation method of claim 1, wherein a time interval between the first time and the second time is equal to a time interval between the second time and the third time.

3. The OLED touch display operation method of claim 1, wherein a time interval between the fourth time and the fifth time is equal to a time interval between the fifth time and the sixth time.

4. The OLED touch display operation method of claim 1, wherein a time interval between the second time and the fifth time is different from a time interval between the first time and the third time.

5. The OLED touch display operation method of claim 1, wherein a time interval between the second time and the fifth time is different from a time interval between the fourth time and the sixth time.

6. The OLED touch display operation method of claim 1, wherein a time interval between the first time and the third time is equal to a time interval between the fourth time and the sixth time.

7. The OLED touch display operation method of claim 1, wherein the touch scan transition timing and the first display multiplexer transition timing have different frequencies.

8. The OLED touch display operation method of claim 1, wherein the touch scan transition timing and the second display multiplexer transition timing have different frequencies.

9. The OLED touch display operation method of claim 1, wherein the first display multiplexer transition timing and the second display multiplexer transition timing have the same frequency.

10. The OLED touch display operation method of claim 1, wherein a time interval between the second time and the fifth time is larger than a time interval between the first time and the third time and a time interval between the fourth time and the sixth time.

* * * * *